United States Patent [19]

d'Heurle et al.

[11] Patent Number: 5,143,867

[45] Date of Patent: Sep. 1, 1992

[54] METHOD FOR DEPOSITING INTERCONNECTION METALLURGY USING LOW TEMPERATURE ALLOY PROCESSES

[75] Inventors: Francois M. d'Heurle, Ossining; James M. E. Harper, Yorktown Heights, both of N.Y.

[73] Assignee: International Business Machines Corp., Armonk, N.Y.

[21] Appl. No.: 654,999

[22] Filed: Feb. 13, 1991

[51] Int. Cl.$^5$ .................................. H01L 21/28
[52] U.S. Cl. ........................ 437/188; 437/196; 148/DIG. 130
[58] Field of Search ............. 437/179, 196, 188; 148/DIG. 130

[56] References Cited

U.S. PATENT DOCUMENTS

| | | | |
|---|---|---|---|
| 4,335,362 | 6/1982 | Salathe et al. ................ | 437/188 |
| 4,434,544 | 3/1984 | Dohya et al. . | |
| 4,493,856 | 1/1985 | Kumar et al. . | |
| 4,673,592 | 6/1987 | Porter et al. . | |
| 4,692,349 | 9/1987 | Georgiou et al. ............. | 437/230 |

OTHER PUBLICATIONS

H. M. Liau et al., "Purification of Metallurgical-Grade Si by the Thermomigration of Impurity Clusters," *Solar Cells,* vol. 10, No. 2, pp. 119-128, Nov. 1983.
Marks, R. F., et al. "Thermally Conductive Bonding of Silicon Chip Employing Metal Multilayer", *IBM Technical Disclosure Bulletin,* 27 (10A):5882 (1985).

*Primary Examiner*—Brian E. Hearn
*Assistant Examiner*—Laura M. Holtzman
*Attorney, Agent, or Firm*—Scully, Scott, Murphy & Presser

[57] ABSTRACT

A method for filling VLSI high aspect ratio vias and lines in VLSI interconnection structures, with a low resistivity metal at temperatures below 400° C. A low melting point alloy of a desired low resistivity metal is deposited into the high aspect ratio vias or lines. The alloy is then purified in place by bringing the alloying element to the surface of the deposited alloy and removing the element from said surface thereby leaving the low resistivity metal in the interconnection structure. In one embodiment, the alloy is purified by using a low temperature oxidation process to allow the alloying element to diffuse to the surface of the deposited alloy where a surface oxide is formed. The surface oxide is then removed by chemical etching or by chemical mechanical polishing. In a second embodiment, a continuous exposure to a plasma etching or reactive ion etching will steadily remove the alloying element from the surface of the deposited alloy. In a third embodiment, the deposited alloy is planarized and then a sink layer is deposited onto the planarized interconnection structure. The structure is annealed in order to allow the alloying element to diffuse into the sink layer. The sink layer is then removed by chemical mechanical polishing.

34 Claims, 2 Drawing Sheets

METHOD FOR DEPOSITING INTERCONNECTION METALLURGY USING LOW TEMPERATURE ALLOY PROCESSES

BACKGROUND OF THE INVENTION

1. Field of the Invention

The present invention relates generally to a method of filling high aspect ratio vias and lines in very-large-scale-integrated (VLSI) metal interconnection structures, and more particularly, to depositing a low melting point alloy of a low resistivity metal into the high aspect ratio vias and lines and then purifying the alloy in place to leave the low resistivity metal in the structure.

2. Description of the Prior Art

The problem of filling high aspect ratio vias (height-to-diameter ratio which exceeds unity) and lines (height-to-width ratio which exceeds unity) in VLSI interconnection structures is usually an extremely difficult one. The problem is increased when the vias and lines have vertical or near-vertical walls in addition to high aspect ratios. For high performance VLSI devices, high conductivity metal interconnections must be formed in high aspect ratio vias and line structures, at submicrometer dimensions. The deposition methods must also operate below 400° C. in order to be compatible with polymer interlevel dielectrics.

Traditional physical vapor deposition (PVD) methods, including sputtering and evaporation, exhibit poor step coverage which limits their ability to fill structures with aspect ratios greater than one. Metal chemical vapor deposition (CVD) is an alternative filling method, but has only been successfully developed for a few specific metals, such as tungsten, in the temperature range below 400° C. Selective electroless plating disclosed in U.S. Pat. No. 4,692,349 has also been successfully used to fill high aspect ratio vias in VLSI devices but has only been developed for cobalt and nickel in the temperature range below 400° C. The final result of the plating technique is a high aspect ratio via filled with a cobalt or nickel alloy without any purification of the deposited alloys. U.S. Pat. No. 4,673,592 discloses a method for filling high aspect ratio vias with intermetallic compounds using multiple steps of deposition and laser assisted removal of excess material from low thermal conductivity areas, such as silicon dioxide. However, high temperatures are required for the removal steps and no purification is disclosed. None of the above-mentioned methods have been successfully developed for gold, silver or copper.

It is well established that sputter deposition at a high fraction of the melting point of a metal is a successful method for filling high aspect ratio vias and lines and even allows planarization during the deposition process. For example, an alloy of $Al_{0.96}Cu_{0.04}$, which has a melting point of 640° C. has been successfully deposited at a temperature of 500° C. However, 500° C. is too high for polymer interlevel dielectrics and furthermore, the Al-4% Cu metallurgy has a much higher resistivity than a pure metal such as gold, silver or copper.

Current efforts for the deposition of copper into high aspect ratio vias and lines in VLSI interconnection structures are focused on the deposition of pure copper directly into the interconnection structure but these efforts have not as of yet been commercially successful. Thus, there is a need to develop a low temperature method for filling high aspect ratio vias and lines with a low resistivity metal such as gold, silver or copper.

SUMMARY OF THE INVENTION

The present invention is directed to a method for filling high aspect ratio vias, lines and other recesses in VLSI interconnection structures including the steps of depositing a low melting point alloy of a metal and an alloying element into the interconnection structure recess and purifying the alloy in place to leave only the metal in the recess. The method of the invention permits high aspect ratio vias and lines to be filled with a low resistivity metal at low temperatures. In accordance with the invention, the alloy of the desired low resistivity metal and the alloying element has a melting temperature below 600° C. The alloy is deposited into the line or via by bias sputtering at a substrate temperature below about 400° C. in order to be compatible with polymer interlevel dielectrics. A high degree of via filling and planarization is achieved by this technique. The interconnection structure is overfilled during the deposition process to allow for subsequent purification and planarization steps.

In one embodiment of the present invention, the alloy is purified by a low temperature oxidation process. By oxidizing the alloy, the alloying element is allowed to diffuse to the surface of the deposited alloy, where a surface oxide is formed. The accumulated surface oxide is then removed by chemical etching, or by chemical mechanical polishing of the surface thereby leaving the pure low resistivity metal in the high aspect ratio via or line.

In a second embodiment, the alloy is purified by continuous exposure to plasma etching or reactive ion etching. When the alloying element is of a type that segregates to the surface of the alloy, a continuous exposure to plasma etching or reactive ion etching will steadily remove the element from the surface thereby leaving the pure low resistivity metal in the high aspect ratio via or line.

In a third embodiment, the purification step is divided into several steps. In this embodiment, the deposited alloy is planarized by chemical mechanical polishing. Next, a sink layer is deposited onto the planarized interconnection structure by evaporation, sputtering or chemical vapor deposition (CVD). The structure is then annealed at a temperature below 400° C. in order to allow the alloying element to dissolve into the sink layer and diffuse away from the line or via region. The final step is to remove the sink layer, which now contains the alloying element, by chemical mechanical polishing thereby leaving the pure low resistivity metal in the high aspect ratio via or line.

After purification of the alloy, there will be excess material above the dielectric surface of the interconnection structure. This material together with any other byproducts of the purification process are removed by chemical mechanical polishing.

BRIEF DESCRIPTION OF THE DRAWINGS

In the drawings, the same reference numerals denote the same structural elements.

DETAILED DESCRIPTION OF THE INVENTION

The present invention is directed to a low temperature method for filling high aspect ratio vias and lines in VLSI interconnection structures with a low resistivity metal. The first step is to fill the via or line with a low melting point alloy of a desired low resistivity metal. The second step is to purify the alloy in place to leave the low resistivity metal in the via or line. Three alternative embodiments are described to purify the alloy, but it should be understood that any suitable technique for purifying the deposited alloy in place is contemplated by the present invention. Moreover, numerous variations in parameters and materials may be used in practicing the invention.

Figure 1:
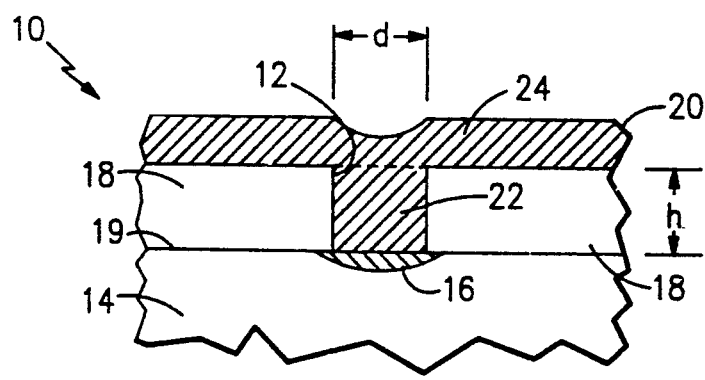
FIG. 1 is a schematic drawing showing the cross-section of a high aspect ratio via or line in a portion of a VLSI interconnection structure after the deposition of the low melting point alloy in accordance with the method of the present invention.

Turning now to the drawings, FIG. 1 is a cross-sectional view of a typical interconnection structure 10 including a high aspect ratio recess 12 to which the principles of the present invention apply. (For illustrative purposes only, the recess 12 will be referred to as a via but it is to be understood by those skilled in the art of filling interconnection structures in VLSI devices that the recess 12 may also be a line or other interconnection recess.) Illustratively, the via 12 is shown as having vertical walls. The aspect ratio of the via 12 is defined by the height (h) divided by the diameter (d) and a high aspect ratio is any ratio greater than (1) one. An interconnection structure is a portion of a VLSI device in which a recess filled with a metal is used to interconnect semiconductor regions, devices or conductive layers located on the VLSI device. As shown in FIG. 1, the interconnection structure 10 includes a silicon substrate 14 having a metal silicide contact 16 formed therein and a main planar surface 19. A dielectric layer 18 is formed on the substrate 14 and includes the via 12 formed therein by well known photolithographic and etching techniques. The dielectric layer 18 may be made, for example, of silicon dioxide or polyimide. The via 12 is the means by which a conductive connection will be made to the contact 16. The contact 16 could be, for example, a metal silicide contact formed on a source, drain or gate region in a VLSI device of the metal-oxide-semiconductor (MOS) type.

The first step of applicants' invention is to provide a low melting point alloy of a metal and an alloy element. In a preferred embodiment of the invention, the alloy consists of a low resistivity metal and an alloying element other than the low resistivity metal wherein the alloy has a melting point below 600° C. The alloy is prepared by standard metallurgical alloying techniques.

Low resistivity metals suitable for filling high aspect ratio vias and lines in VLSI interconnection structures in accordance with the method of the present invention include gold, silver and copper. Suitable alloying elements which can be used to form gold alloys for the present method, listing their eutectic melting temperatures in parentheses, include silicon (363° C.), germanium (361° C.), lead (213° C.), antimony (360° C.), and aluminum (525° C.). Suitable alloying elements which can be used to form silver alloys for the present method, listing their eutectic melting temperatures in parentheses, include aluminum (567° C.), calcium (547° C.), cerium (508° C.), europium (429° C.), lanthanum (535° C.), lithium (145° C.), magnesium (472° C.), lead (304° C.), and antimony (485° C.). Suitable alloying elements which can be used to form copper alloys for the present method, listing their eutectic melting temperatures in parentheses, include calcium (482° C.), barium (458° C.), aluminum (548° C.), europium (437° C.), lanthanum (475° C.), magnesium (552° C.), antimony (526° C.), selenium (523° C.), strontium (507° C.) and tellurium (340° C.).

As shown in FIG. 1, a low melting point alloy 20 of a low resistivity metal is deposited into the via 12 to form the via plug 22. The via 12 is overfilled during the deposition process and the alloy extends over the dielectric layer 18 to form the surface layer 24 in order to allow for the subsequent purification and planarization steps. In order to be compatible with polymer interlevel dielectrics, the alloy must be deposited at a temperature below 400° C. The alloy is deposited into the via 12 by bias sputtering at a deposition temperature below the alloy melting point. The deposition temperature may be near the alloy melting point or just below 400° C. whichever is lower.

After deposition of the low melting point alloy 20, the next step is to purify the alloy 20 in place to leave the desired low resistivity metal in the via 12. This can be accomplished by any one of the embodiments described below, or any other suitable technique.

Figure 2A:
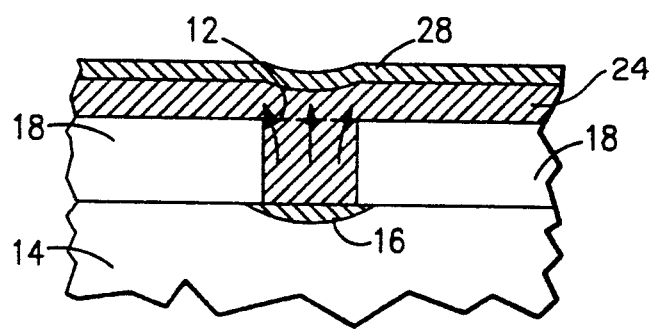
FIGS. 2A-2B are sectional views of various stages of the purification step in accordance with one embodiment of the method for filling high aspect ratio vias and lines with a low resistivity metal.

In the first purification embodiment the alloy 20 is purified by a low temperature oxidation process. As shown by the arrows in FIG. 2A, this process allows the alloying element to diffuse to the surface of the surface layer 26, where a surface oxide 28 is formed. In the oxidation process for purifying the alloy 20, the heat of formation of the oxide of the alloying element must exceed the heat of formation of the oxide of the low resistivity metal. This requirement is satisfied by all of the alloys listed above. The temperature during oxidation must be kept below 400° C. or the alloy melting temperature whichever is lower.

Figure 2B:
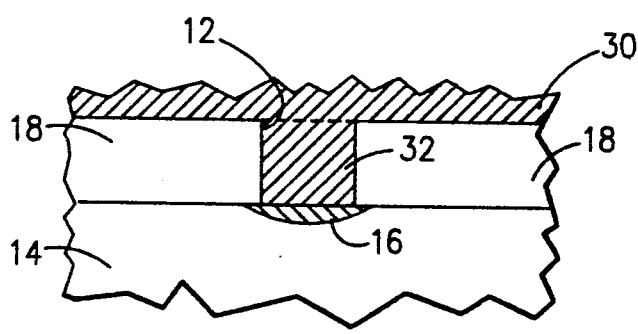
Figure 5:
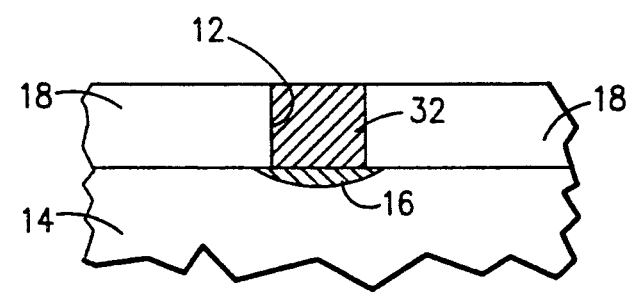
FIG. 5 is a schematic drawing showing the cross-section of a high aspect ratio via or line in a portion of a VLSI interconnection structure wherein the via or line has been filled with a low resistivity metal in accordance with the method of the present invention.

Referring now to FIG. 2B, the accumulated surface oxide 28 can be removed by chemical etching. However, there will be a surface layer 30 remaining above the dielectric layer 18. The surface layer 30 consists of excess low resistivity metal and byproducts of the oxidation process. The surface layer 30 is removed by chemical mechanical polishing. As shown in FIG. 5, the final result is a high aspect ratio via 12 filled with a low resistivity metal plug 32.

Alternatively, the surface oxide 28 can be removed by chemical mechanical polishing directly in order to obtain the interconnection structure of FIG. 5 thereby eliminating the need to use chemical etching.

In a second embodiment, the alloying element is removed by continuous exposure to plasma etching or reactive-ion-etching (RIE). This purification technique will work for those alloying elements which segregate to the surface of the alloy surface layer 24 such as silicon, germanium and aluminum.

For alloys that contain silicon or germanium as the alloying element fluorocarbon gases can be used as an etching gas and for alloys that contain aluminum as the alloying element chlorine gas can be used as the etching gas in the plasma or reactive-ion etching process. It is to be understood by those skilled in the art of plasma etching and RIE that other alloying elements can be removed by such etching techniques by using etching gases other than chlorine and fluorocarbons.

Figure 3:
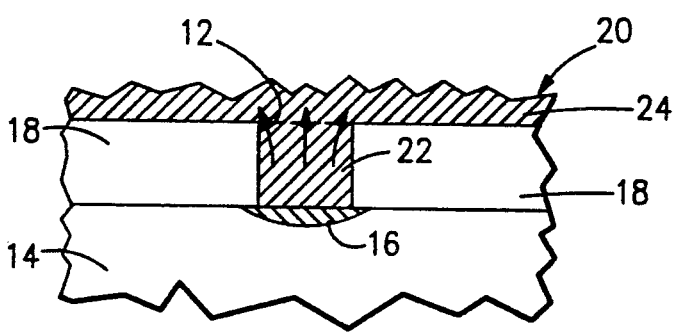
FIG. 3 is sectional view of one stage of the purification step in accordance with a second embodiment of the method of the present invention.

In this embodiment, a small amount of the alloying element will segregate to the surface of the surface layer 24 during the deposition of the alloy 20 because of the heat used during deposition. As shown by the arrows in FIG. 3, the rest of the alloying element will segregate to the surface of the surface layer 24 during continuous exposure to a plasma etching or reactive ion etching (RIE) environment which will also remove this element from the surface layer 24. Thus, the etch simultaneously segregates the alloying element to the surface layer and removes the segregated alloying element from the surface layer. The speed at which the alloying element is removed from the alloy 20 depends on the segregation rate of the alloying element and the temperature used during plasma etching or RIE. In order to be compatible with polymer interlevel dielectrics, temperatures up to 400° C. can be used to speed up the process.

After purifying the alloy by continuous exposure to plasma etching or RIE there will be an excess of low resistivity metal above the dielectric layer 18 together with byproducts of the etching process. The excess and byproducts are then removed by chemical mechanical polishing which results in the filled interconnection structure of FIG. 5.

Figure 4A:
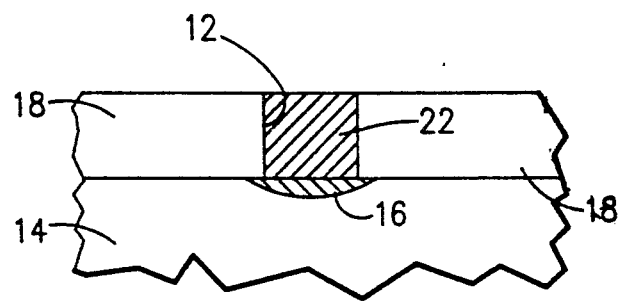
FIGS. 4A-4B are sectional views of various stages of the purification step in accordance with a third embodiment of the method of the present invention.
Figure 4B:
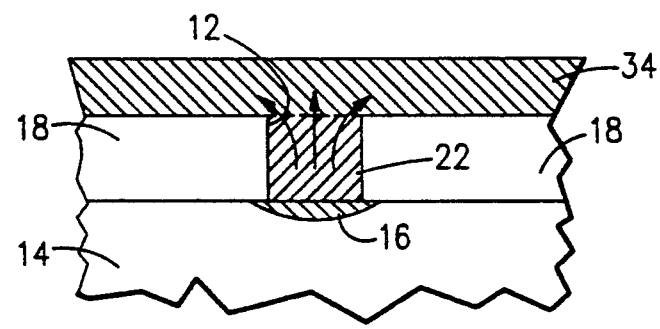

FIGS. 4A–4B show a third embodiment of the present method wherein a sink layer 34 is used to purify the alloy plug 22. This purification technique is applicable whenever purification of a deposited metal alloy is required. After an alloy has been deposited in the high aspect ratio via 12, the interconnection structure is planarized by chemical mechanical polishing. This will result in the interconnection structure shown in FIG. 4A, having an alloy plug 22.

Referring now to FIG. 4B, a sink layer 34 is then deposited onto the planarized structure of FIG. 4A. Since the surface is flat, the sink layer 34 may be deposited by evaporation, sputtering or chemical vapor deposition. The sink layer 34 is composed of the same material as the low resistivity metal which is desired to be deposited into the via 12.

The next step in this purification method is to anneal the interconnection structure of FIG. 4B at a temperature below 400° C. As shown by the arrows in FIG. 4B, the annealing will cause the alloying element to dissolve into the sink layer 34 and diffuse away from the via region 12. If the sink layer 34 is the same material as the low resistivity metal, any loss of volume in the via metal due to loss of the alloying element will be replaced by additional metal provided from the sink layer 34. After the alloying element is uniformly dissolved into the sink layer 34, its concentration in the via 12 will have been diluted to a low level such that the resistivity of the metal remaining in the via 12 is very close to that of the pure low resistivity metal.

The final step is to remove the sink layer 34, which now contains the alloying element, by chemical mechanical polishing thereby leaving the high aspect ratio via 12 with a very low concentration of the alloying element (or other impurities), and at an acceptable low resistivity. The final result is the high aspect ratio via 12 filled with a low resistivity metal plug 32 as shown in FIG. 5.

Figure 6:
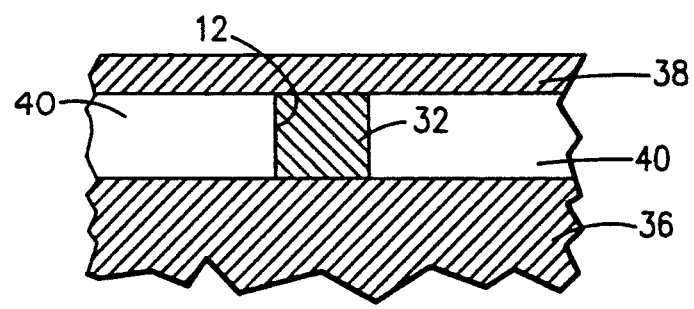
FIG. 6 is a schematic drawing showing the cross-section of a high aspect ratio via or line in a portion of another VLSI interconnection structure wherein the via or line has been filled with a low resistivity metal in accordance with the method of the present invention.

FIG. 6 illustrates the use of a high aspect ratio via 12 filled with a low resistivity metal plug 32 in accordance with this invention employed to interconnect conductive layers 36 and 38 which are separated by dielectric layer 40. By way of example, each of the conductive layers 36 and 38 are made of aluminum and the dielectric layer 40 can be made of silicon dioxide, polyimide or glass.

While the invention has been particularly shown and described with respect to the illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what is claimed as new and what is desired to be secured by Letters Patent is:

1. A method for filling a VLSI high aspect ratio recess in an interconnection structure defined in a dielectric layer disposed on one main planar surface of a substrate with a metal comprising the steps of:
   (a) providing a low melting point alloy of a metal and an alloying element;
   (b) depositing said alloy into the recess of the interconnection structure at a deposition temperature which is below the alloy melting point;
   (c) purifying said alloy by diffusing the alloying element to a surface layer formed on said dielectric layer and removing said surface layer, thereby leaving the metal in the interconnection structure.

2. The method of claim 1, wherein said alloy has a melting point below about 600° C.

3. The method of claim 1, wherein said metal is a low resistivity metal comprising a metal selected from the group consisting of gold, silver and copper.

4. The method of claim 1, wherein said alloying element comprises an element selected from the group consisting of silicon, germanium, lead, aluminum, calcium, antimony, cerium, europium, lanthanum, lithium, magnesium, barium, selenium, strontium and tellurium.

5. The method of claim 1, wherein said metal comprises a metal selected from the group consisting of gold, silver and copper and wherein said alloying element comprises an element selected from the group consisting of silicon, germanium, lead, aluminum, calcium, antimony, cerium, europium, lanthanum, lithium, magnesium, barium, selenium, strontium and tellurium.

6. The method of claim 1, wherein said depositing step comprises depositing said alloy by bias sputtering.

7. The method of claim 1, wherein said deposition temperature is below about 400° C.

8. The method of claim 1, wherein said purifying step includes oxidizing the element thereby diffusing the element to a surface of the surface layer in the form of a surface oxide.

9. The method of claim 8, wherein said purifying step includes chemical etching the surface oxide thereby removing the alloying element from the structure.

10. The method of claim 8, wherein said purifying step includes chemical mechanical polishing the surface oxide thereby removing the alloying element from the structure.

11. The method of claim 1, wherein said purifying step includes continually exposing the structure to plasma etching thereby simultaneously segregating the alloying element to a surface of said surface layer and removing the segregated alloying element from the surface layer.

12. The method of claim 1, wherein said purifying step includes continually exposing the structure to reactive ion etching thereby simultaneously segregating the alloying element to a surface of said surface layer and removing the segregated element from the surface layer.

13. The method of claim 9, further including the step of planarizing the surface of said structure.

14. The method of claim 11, further including the step of planarizing the surface of said structure.

15. The method of claim 12, further including the step of planarizing the surface of said structure.

16. The method of claim 13, wherein said planarizing step comprises removing excess material on the dielectric layer by chemical mechanical polishing.

17. The method of claim 14, wherein said planarizing step comprises removing excess material on the dielectric layer by chemical mechanical polishing.

18. The method of claim 15, wherein said planarizing step comprises removing excess material on the dielectric layer by chemical mechanical polishing.

19. The method of claim 1, wherein said purifying step comprises the steps of:
    (a) planarizing said dielectric layer;
    (b) depositing a sink layer onto the planarized dielectric layer;
    (c) annealing the structure thereby diffusing the alloying element into the sink layer; and
    (d) removing the sink layer.

20. The method of claim 19, wherein the dielectric layer is planarized by chemical mechanical polishing.

21. The method of claim 19, wherein said sink layer is deposited by evaporation.

22. The method of claim 19, wherein said sink layer is deposited by sputtering.

23. The method of claim 19, wherein said sink layer is deposited by chemical vapor deposition.

24. The method of claim 19, wherein said structure is annealed at a temperature below about 400° C.

25. The method of claim 19, wherein the sink layer is removed by chemical-mechanical-polishing.

26. The method of claim 19, wherein the sink layer comprises a metal selected from the group consisting of gold, silver and copper.

27. A method for purifying an alloy of a metal and an alloy element deposited in an interconnection structure defined in a dielectric layer disposed on one main planar surface of a substrate comprising the steps of:
    (a) planarizing the dielectric layer;
    (b) depositing a sink layer onto the planarized dielectric layer;
    (c) annealing the structure thereby diffusing the alloy element into the sink layer; and
    (d) removing the sink layer.

28. The method of claim 27, wherein the dielectric layer is planarized by chemical mechanical polishing.

29. The method of claim 27, wherein said sink layer is deposited by evaporation.

30. The method of claim 27, wherein said sink layer is deposited by sputtering.

31. The method of claim 27, wherein said sink layer is deposited by chemical vapor deposition.

32. The method of claim 27, wherein said structure is annealed at a temperature below about 400° C.

33. The method of claim 27, wherein said sink layer is removed by chemical mechanical polishing.

34. The method of claim 27, wherein the sink layer comprises a metal selected from the group consisting of gold, silver and copper.

* * * * *

UNITED STATES PATENT AND TRADEMARK OFFICE
CERTIFICATE OF CORRECTION

PATENT NO.  : 5,143,867
DATED       : September 1, 1992
INVENTOR(S) : Francois M. D'Heurle, et al.

It is certified that error appears in the above-identified patent and that said Letters Patent is hereby corrected as shown below:

On title page, item [75]; after "N.Y."
insert --; John L. Mauer IV, South Kent, CT.--

Signed and Sealed this

Fifth Day of October, 1993

Attest:

BRUCE LEHMAN

Attesting Officer

Commissioner of Patents and Trademarks